(12) United States Patent
Ziesler

(10) Patent No.: US 7,782,988 B2
(45) Date of Patent: Aug. 24, 2010

(54) DIGITAL FREQUENCY SYNTHESIZER

(75) Inventor: Conrad Havluj Ziesler, Seattle, WA (US)

(73) Assignee: Multigig Inc., San Jose, CA (US)

( * ) Notice: Subject to any disclaimer, the term of this patent is extended or adjusted under 35 U.S.C. 154(b) by 1335 days.

(21) Appl. No.: 11/121,161

(22) Filed: May 2, 2005

(65) Prior Publication Data
US 2006/0245532 A1 Nov. 2, 2006

(51) Int. Cl.
H04L 7/02 (2006.01)
H04L 7/00 (2006.01)

(52) U.S. Cl. ......... 375/354; 375/359; 375/371; 375/373

(58) Field of Classification Search ......... 375/354–376
See application file for complete search history.

(56) References Cited

U.S. PATENT DOCUMENTS

| | | | | |
|---|---|---|---|---|
| 5,335,253 A * | 8/1994 | Oliver et al. | ............... | 377/48 |
| 6,121,816 A * | 9/2000 | Tonks et al. | ............... | 327/296 |
| 6,181,213 B1 * | 1/2001 | Chang | ............... | 331/34 |
| 6,373,911 B1 * | 4/2002 | Tajima et al. | ............... | 375/375 |
| 6,392,462 B2 | 5/2002 | Ebuchi et al. | | |
| 6,404,247 B1 * | 6/2002 | Wang | ............... | 327/158 |
| 6,542,013 B1 * | 4/2003 | Volk et al. | ............... | 327/115 |
| 6,590,461 B2 | 7/2003 | Kawano | | |
| 6,686,784 B2 * | 2/2004 | Chang | ............... | 327/157 |
| 6,803,830 B2 * | 10/2004 | Scheffler | ............... | 331/36 C |
| 6,815,987 B2 * | 11/2004 | Hsu et al. | ............... | 327/156 |
| 6,943,598 B2 | 9/2005 | Ghazali et al. | | |
| RE40,939 E * | 10/2009 | Huang | ............... | 375/376 |
| 2002/0174374 A1* | 11/2002 | Ghaderi et al. | ............... | 713/500 |
| 2003/0131155 A1* | 7/2003 | Hsu et al. | ............... | 710/1 |
| 2003/0198311 A1* | 10/2003 | Song et al. | ............... | 375/376 |
| 2005/0063505 A1* | 3/2005 | Dubash et al. | ............... | 375/376 |
| 2005/0212577 A1* | 9/2005 | Madni et al. | ............... | 327/175 |
| 2005/0237090 A1 | 10/2005 | Lanier | | |
| 2006/0025094 A1 | 2/2006 | Ozawa et al. | | |
| 2007/0257736 A1* | 11/2007 | Beccue | ............... | 331/57 |
| 2007/0285176 A1* | 12/2007 | North | ............... | 331/8 |
| 2008/0094145 A1* | 4/2008 | Kuan et al. | ............... | 331/11 |
| 2009/0066423 A1* | 3/2009 | Sareen et al. | ............... | 331/19 |

OTHER PUBLICATIONS

PCT International Search Report from PCT/US2006/16596 dated Mar. 6, 2007.

* cited by examiner

*Primary Examiner*—David C Payne
*Assistant Examiner*—Linda Wong
(74) *Attorney, Agent, or Firm*—IPxLaw Group LLP

(57) ABSTRACT

A system and method for synthesizing a frequency using a multi-phase oscillator. A state machine operating on one of the phases of the oscillator computes, based on a pair of input integers, a phase select vector that indicates when a particular phase of the multi-phase oscillator should be selected when a transition of the waveform of the output frequency is needed. The phase select vector is then re-timed to form a retimed phase vector so that each phase select signal is in phase with signal it is designed to select. The signals in the retimed phase vector then can be combined to create the output frequency directly or can be used to select the corresponding phase of the multi-phase oscillator, if more accuracy is desired. In one embodiment, the multi-phase oscillator is a rotary traveling wave oscillator which provides highly accurate multiple phases.

28 Claims, 13 Drawing Sheets

DIGITAL FREQUENCY SYNTHESIZER

CROSS-REFERENCE TO RELATED APPLICATIONS

This application incorporates by reference U.S. Pat. No. 6,556,089, issued on Apr. 29, 2003, titled "Electronic Circuitry".

FIELD OF THE INVENTION

The present invention relates generally to digital frequency synthesis and more particularly to synthesized frequencies that have high accuracy and low jitter.

DESCRIPTION OF THE RELATED ART

It is desirable to create a frequency synthesis circuit having integer inputs M, N, with M/N<1, so that a lower frequency clock can be synthesized from a rotary clock, usually running at a high frequency. Conventional synthesizers, shown in FIGS. 1A and 1B have problems with both jitter and cumulative inaccuracy.

Jitter results from having only a limited number of phases, as shown in FIG. 1A and 1B, such that if the synthesized frequency requires a phase that is not present, phases on either side of the missing phase must be used. For example, if it is desired to synthesize T1=4.25To, and only four phases are available, then sometimes a phase giving T1=4To and sometimes a phase giving T1=5To must be chosen to achieve the correct average period of the synthesized waveform.

Cumulative inaccuracy results from the state machine 22, in FIG. 1B, using its own output as the clock. In the given example, each time the state machine 22 clocks itself from a phase that is either earlier than the correct phase or later than the correct phase, that error persists and accumulates in the output signal.

Both the jitter and cumulative inaccuracy limit the applications for such a frequency divider. Thus, it is desirable to have a digital frequency synthesizer that has lower cumulative inaccuracy and lower jitter to extend the range of applications to which such a divider an be applied.

BRIEF SUMMARY OF THE INVENTION

The present invention is directed toward such a need. The present invention employs an oscillator with p phases (as many as 32 or more) and uses a state machine that uses the p phases of the oscillator (one of which is the clock to the state machine) to synthesize a new waveform having a frequency that is controlled by two integer values, M and N, with M/N less than one. The state machine is designed to eliminate any cumulative error that can result in the synthesis operation.

Additional components, a retiming network and a combining network, achieve a synthesized clock with low jitter (low phase noise).

One embodiment of the present invention is a frequency synthesizer for synthesizing a waveform having an output frequency $f_1$. The circuit includes phase selection circuitry, a retiming network, and clock construction circuitry. The phase selection circuitry has a clock input for receiving an input frequency provided by at least one of the plurality of phase signals of a multi-phase oscillator with frequency $f_o$, data inputs for receiving a first integer M and a second integer N, and a plurality of phase-selection outputs. The phase-selection circuitry computes, based on the first and second integers, when to activate the phase-selection output that corresponds to one of the phase signals of the multi-phase oscillator to produce a transition in the waveform of the output frequency such that there are M cycles of the output frequency for N cycles of the input frequency and the ratio M/N is less than one. The retiming network has inputs that receive the plurality of phase signals of the multi-phase oscillator and the plurality of phase-selection outputs and outputs that carry re-timed signals. The retiming network re-times each phase-selection output so that each re-timed output is synchronous with the oscillator phase signal corresponding to the phase-selection output. The clock construction circuitry constructs the output frequency waveform based on the re-timed outputs of the retiming network.

Another embodiment is a method of synthesizing a waveform of an output frequency from the phase signals of a multi-phase oscillator which oscillates at frequency $f_1$. The method includes the steps of activating one of a plurality of phase selection outputs, retiming each phase selection output, selecting a phase signal of the multi-phase oscillator, and combining each selected phase signal of the multi-phase oscillator to form the waveform of the output frequency. In the step of activating, one of the plurality of phase selection outputs is activated in response to an input frequency and first and second integers M and N to select one of the phase signals of the multi-phase oscillator to produce a transition in the waveform of the output frequency such that there are M cycles of the output frequency for N cycles of the input frequency and the ratio M/N is less than one, and the selected phase signal is such as to prevent accumulation of error in the output frequency. In the step of retiming, each phase selection output is retimed so that it is synchronous with the oscillator phase selection signal selectable by the phase-selection output. In the step of selecting, the phase signal of the multi-phase oscillator is selected using the retimed phase-selection output.

Yet another embodiment is a method of synthesizing a waveform of an output frequency from the phase signals of a multi-phase oscillator. The method includes the steps of activating one of a plurality of phase selection outputs, retiming each phase selection output, and combining each retimed phase selection output to form the waveform of the output frequency. In the step of activating one of the plurality of phase selection outputs, the phase selection outputs are activated in response to an input frequency and first and second integers M and N, to produce a transition in the waveform of the output frequency such that there are M cycles of the output frequency for N cycles of the input frequency and the ratio M/N is less than one. The activated selection output corresponds to the phase signal that prevents any accumulation of error in output frequency. In the step of retiming, each phase selection output is retimed so that it is synchronous with the oscillator phase signal corresponding to the phase selection output.

An advantage of the present invention is that there is no accumulation of error in the synthesized output frequency leading to greater accuracy in the output frequency, which makes the invention useful for a greater variety of applications.

Another advantage of the present invention is that jitter can be held to a minimum by using a large number of phase signals.

Yet another advantage is that the amount of circuitry needed to implement the present invention does not increase by a large factor when a large number of phase signals of a multi-phase oscillator is used.

Yet another advantage is that, because of the small amount of circuitry needed to implement the present invention, the invention can be used in multiple places in a design to create a fully phase coherent system.

Yet another advantage is that the state machine in the phase selection circuitry need only operate at the frequency of the multi-phase oscillator, no matter how many phases of the oscillator are available.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1A:
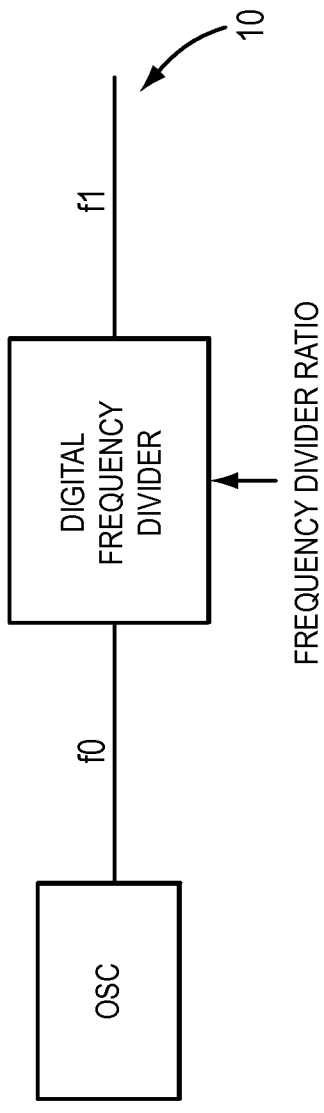
FIGS. 1A and 1B show block diagrams of conventional circuitry for creating a waveform having a desired frequency.
Figure 1B:
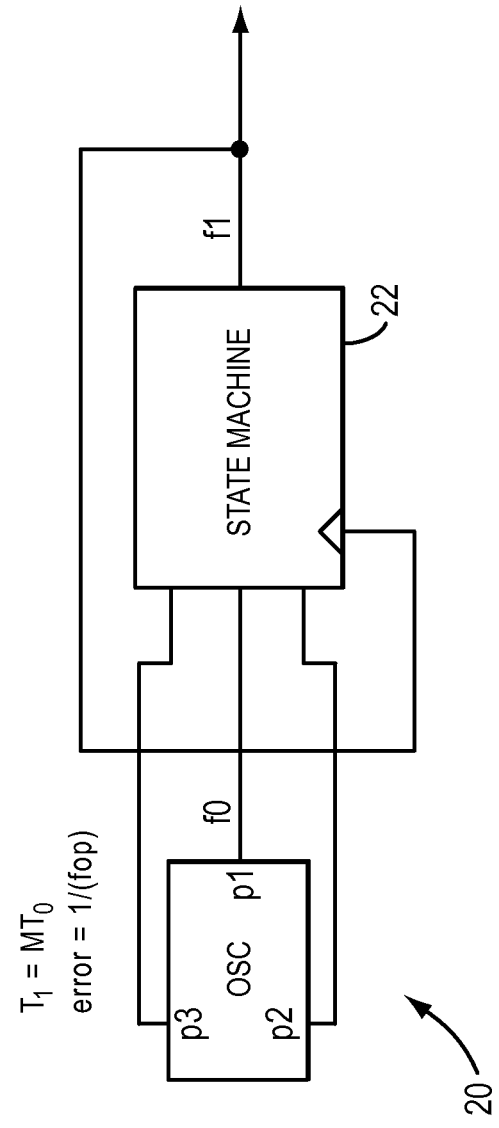
Figure 2A:
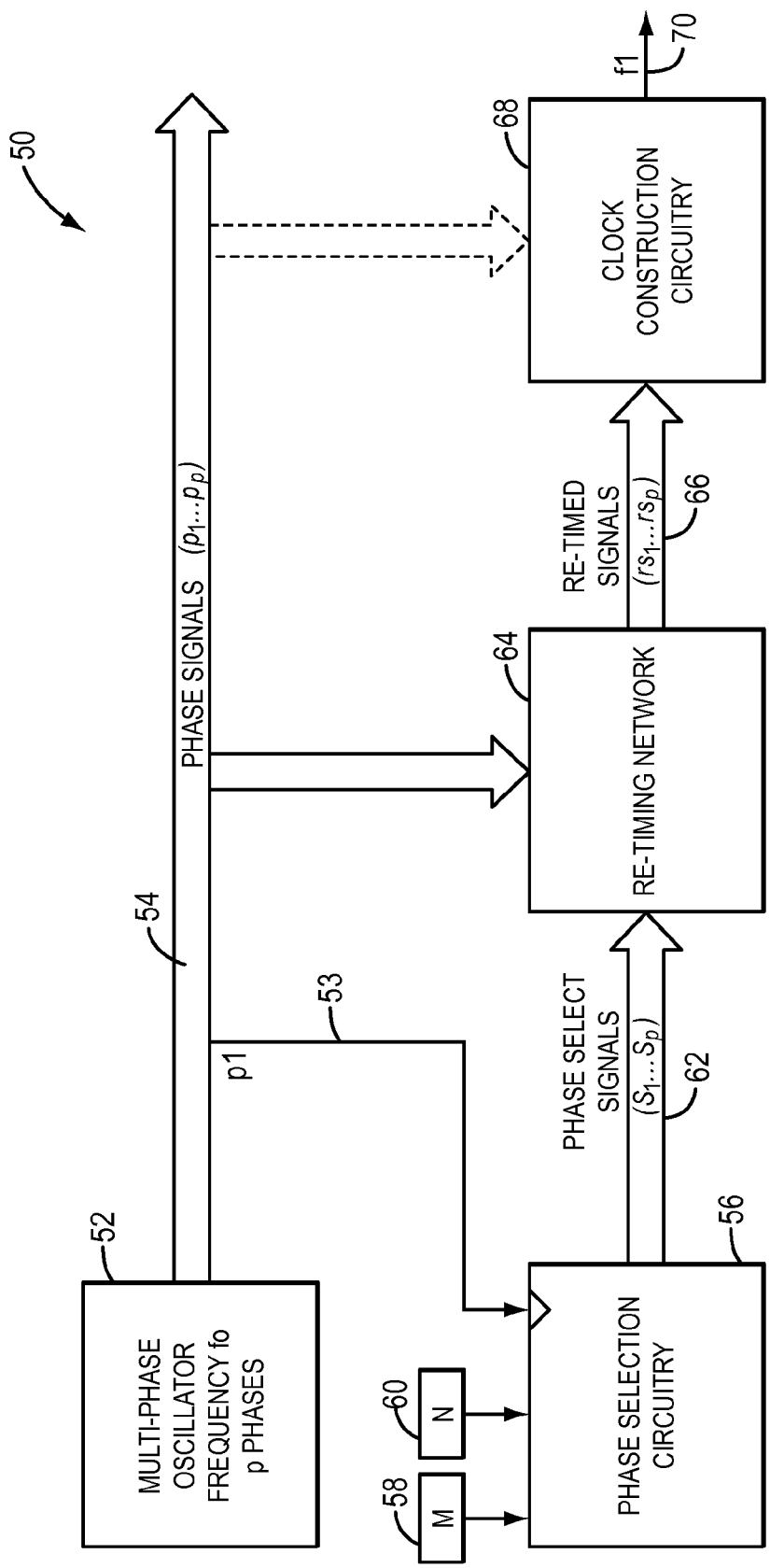
FIG. 2A shows block diagram in accordance with an embodiment of the present invention.

FIG. 2A shows block diagram the circuitry 50 of the present invention. The blocks include a multi-phase oscillator 52, phase selection circuitry 56, a retiming network block 64, and clock construction circuitry 68.

The multi-phase oscillator 52 provides a plurality p of phases, $(p_1 \ldots p_p)$ 54, at a given frequency $f_0$. In one embodiment, the multi-phase oscillator 52 is a rotary traveling wave oscillator described in U.S. Pat. No. 6,556,089.

The phase selection circuitry 56 is clocked by one of the phases (p1 is shown) of the oscillator and, using the two integers M 58 and N 60, provides the p phase select signals $s_1 \ldots s_p$ 62, only one of which is active at any given time. The phase selection circuitry 56 implements an algorithm that prevents errors from accumulating in the synthesized frequency by selecting, at each selection time, a phase with the least error. A selection time is the point in time at which a transition of the output frequency is required. Thus, if the output frequency has a period that is 4.25 times the period of the input frequency, then there is a selection point every 4.25 cycles of the input frequency.

The retiming network 64 receives the p phase select signals $(s_1 \ldots s_p)$ 62 from the phase selection circuitry 56 and the p phases $(p_1 \ldots p_p)$ 54 of the multi-phase oscillator 52 and positions, in time, the phase select signals to have a phase that is consistent with the phase being selected by the signal. Thus, if a phase 2 select signal is active, then it is re-timed to occur on phase 2 of the multi-phase oscillator. The re-timed signals 66 are designated $(rs_1 \ldots rs_p)$.

The clock construction circuitry 68 receives the p retimed select signals $(rs_1 \ldots rs_p)$ 66 and optionally, the phase signals 54 from the multi-phase oscillator 52, to construct the synthesized clock $f_1$ 70 at the desired frequency $f_1=(M/N)f_0$, where M 58 and N 60 are integers and the ratio M/N is less than 1.

Figure 2B:
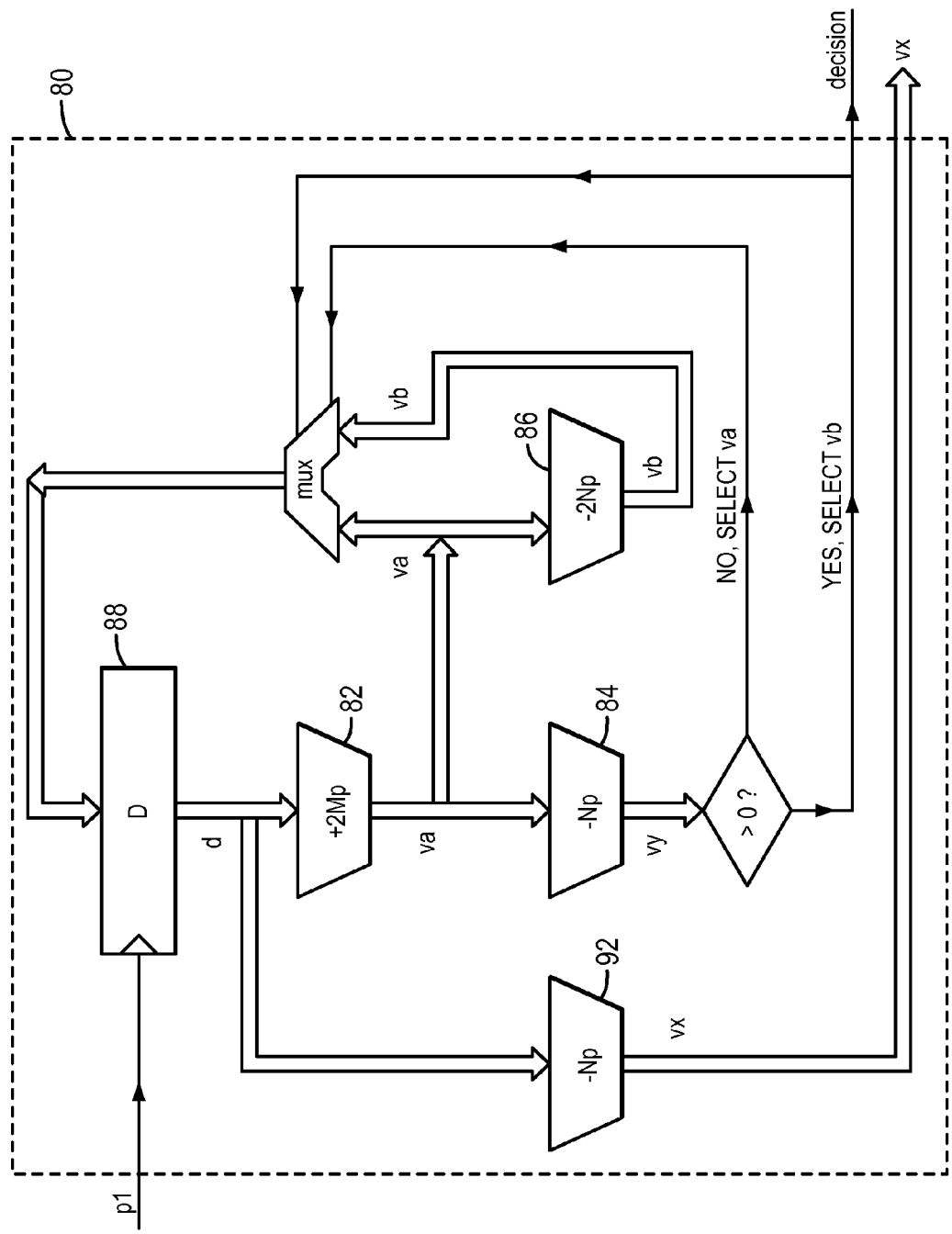
FIG. 2B shows an embodiment of the state machine circuitry for use in the phase selection circuitry of the present invention.

FIG. 2B shows an embodiment of the state machine circuitry 80 for use in the phase selection circuitry 56 of the present invention. The state machine circuitry 80 comprises a collection of adders and multipliers 82, 84, 86 and an accumulator, called the D-register, for holding an accumulating decision parameter used by the phase select retiming network to create the phase select outputs. The adders and multipliers 82, 84, 86 operate on the integers M and N supplied to the state machine to implement an algorithm for selecting the phase with the least error in the construction of the new frequency. In one embodiment, the Bresenham line drawing algorithm is used.

In a rasterization application there are a limited number of pixel locations in an array available for selection when drawing a straight line. This requires, for most lines, that a choice be made of the pixel closest to the desired line. The Bresenham algorithm is designed to make these choices so as to prevent the cumulative error when drawing the line. Ideally, for line drawing, each step (1 ... n) in the x-direction (assuming a slope less than one) is taken to be a unit step and each increment in the y-direction is taken to be the slope m of the line, according to the equation y=mx. However, because there is a discrete number of pixels available, selection of an actual pixel at the exact position needed in the y-direction is usually not possible. In the y-direction, either the current or next pixel in the y-direction must be chosen (i.e., y-value must be incremented by 0 or 1), because of the lack of intermediate values. In the Bresenham algorithm, the rule for the first pixel is the following:

$$0 \leq m < \frac{1}{2} \rightarrow y = y + 0 \qquad (1)$$

$$\frac{1}{2} \leq m \leq 1 \rightarrow y = y + 1 \qquad (2)$$

Thus, if the y-increment is closer to zero than to 1, zero is chosen, otherwise 1 is chosen. This guarantees that the error is never more than ½ of a pixel. To simplify the test, the slope m is restricted, $\{m: 0 \leq m \leq 1\}$, and the quantity ½ is subtracted from the inequality, resulting in the following tests:

$$\left(m - \frac{1}{2}\right) < 0 \rightarrow y = y + 0 \qquad (3)$$

$$0 \leq \left(m - \frac{1}{2}\right) \rightarrow y = y + 1. \qquad (4)$$

Given that the slope m=Δy/Δx where Δx is the total integer number of steps in the x-direction and Δy is the total integer number of steps in the y-direction, if the tests are scaled with the quantity 2Δx, then only integer calculations are needed. Tests (3) and (4), which are for the first pixel, then become $(e=2\Delta y-\Delta x)<0 \rightarrow y=y+0$ (5)

$(e=2\Delta y-\Delta x)\geq 0 \rightarrow y=y+1$ (6).

Thus, for n=1, $e_1=2\Delta y-\Delta x$ is tested. For n<1, the quantity $e_n=e_{n-1}+2\Delta y$ is tested. If y is incremented (because the tested quantity is positive), an adjustment is made $e_n=e_{n-1}+2\Delta y-2\Delta x$ prior to the next test (so that the same test applies after y is incremented).

In the case of synthesizing a new frequency, instead of drawing a line, there is a limited number of phase steps (instead of pixels) that are available.

Figure 2C:
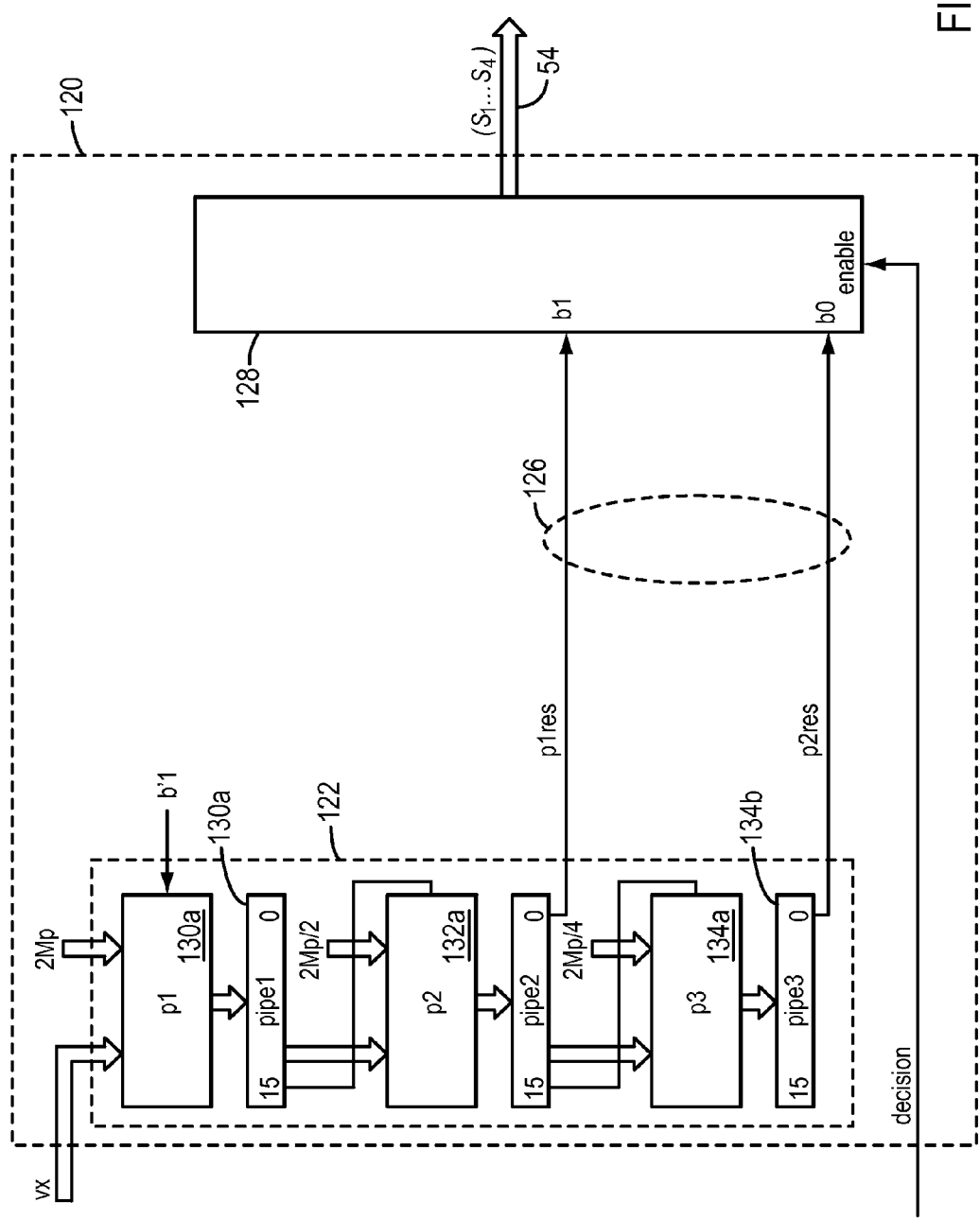
FIG. 2C shows an embodiment of the encoding and decoding circuitry for use in the phase selection circuitry of the present invention.
Figure 2D:
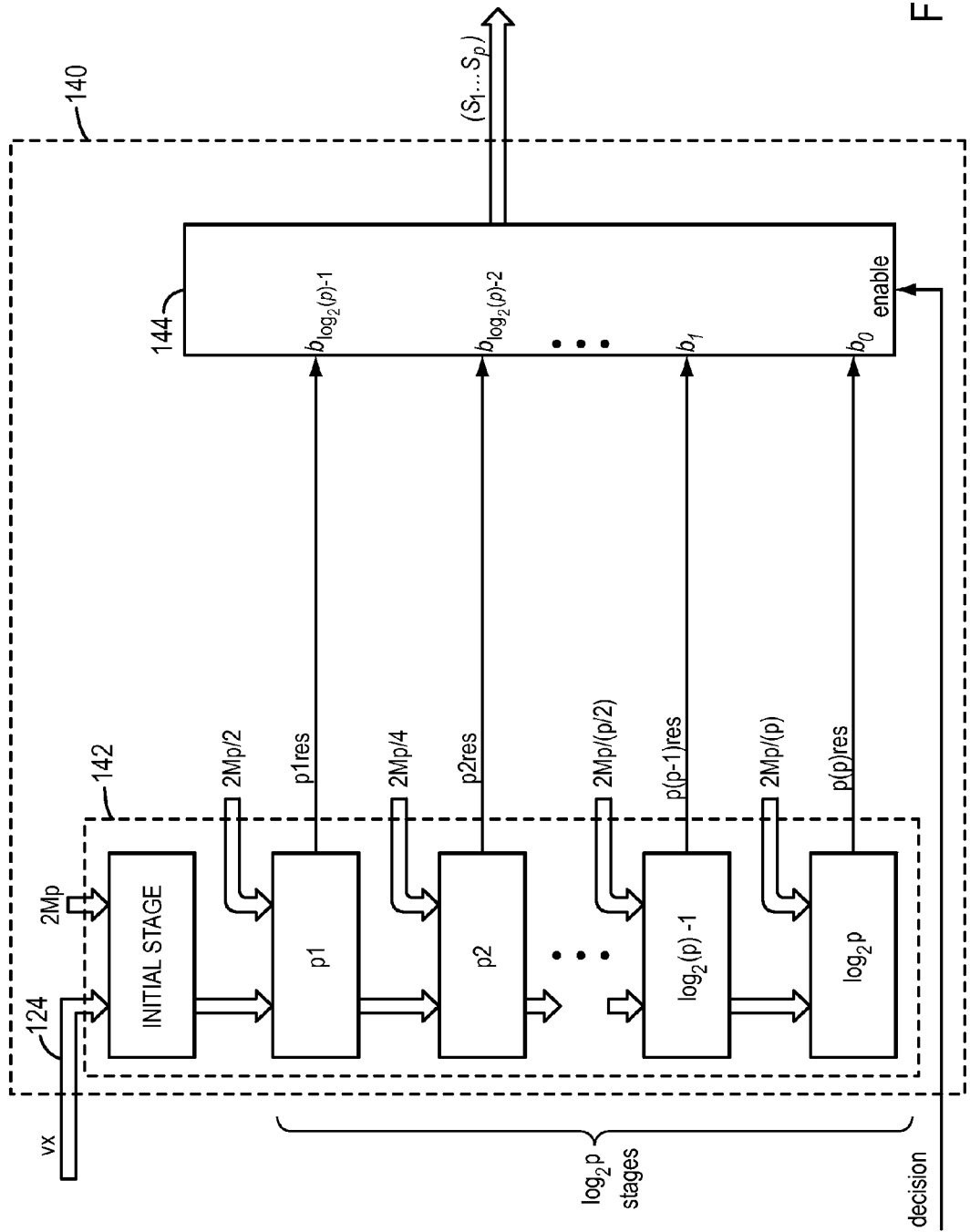
FIG. 2D shows a general embodiment of the encoding and decoding circuitry for use in the phase selection circuitry of the present invention.
Figure 2E:
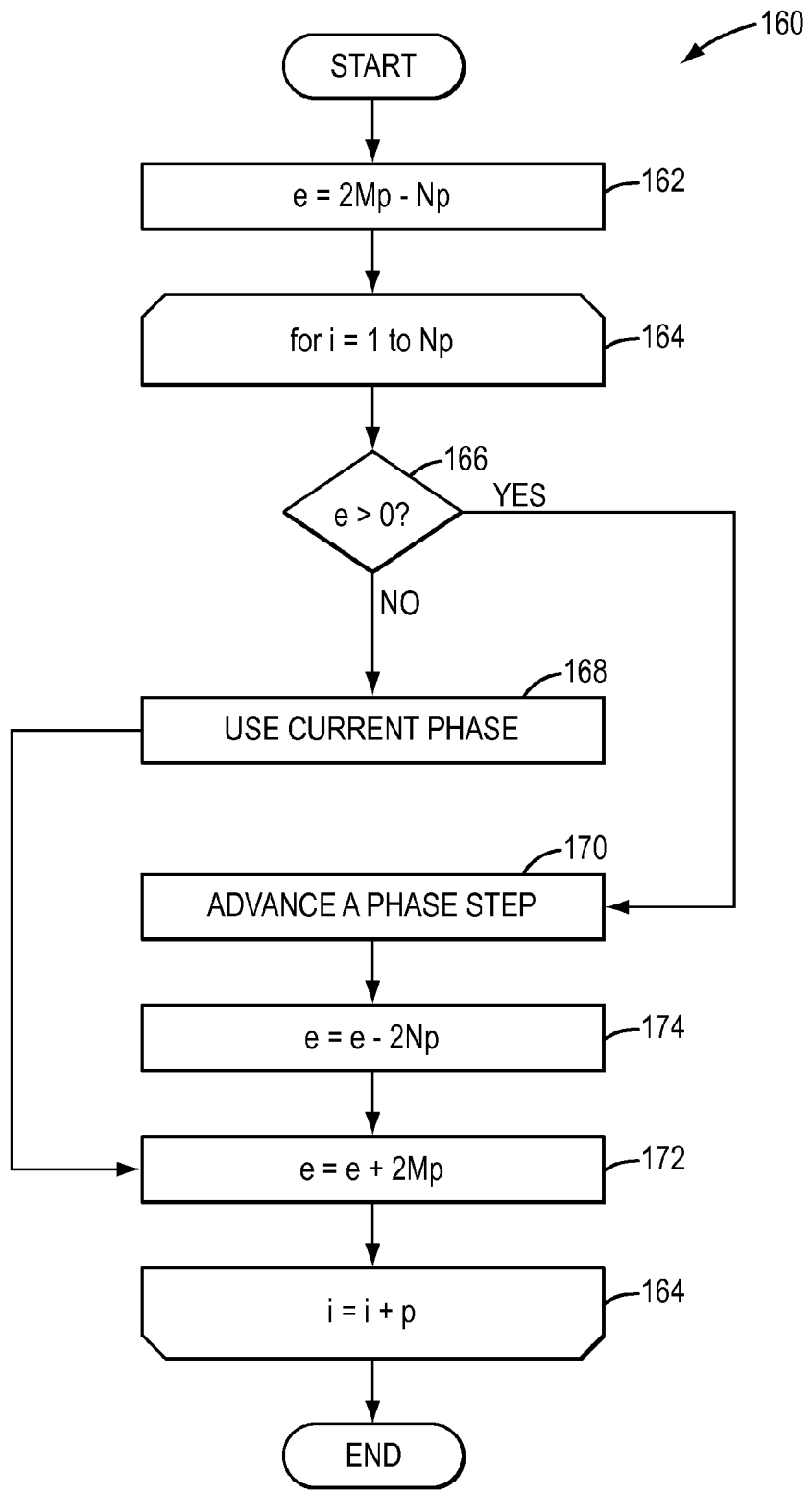
FIG. 2E shows the algorithm implemented by state machine circuitry of the present invention.

FIG. 2E shows the algorithm 160 implemented by state machine circuitry of the present invention as applied to phase steps. In step 162, the parameter e is initialized to 2 Mp−Np. A loop 164 is then entered. In the loop the following occur. For each phase step from 1 to Np phases, the parameter e is tested, in step 166, to see if it is greater than zero. If the parameter e is negative, then the current phase is used at the transition of the output frequency, in step 168, and the parameter e is modified by adding, in step 172, the quantity 2 Mp to it. The counter is incremented and the loop continues. If the parameter e is positive (as a result of adding quantity Mp to e a number of times), as determined in step 166, then a new phase is selected at the transition of the output waveform, in step 170. The parameter e is modified by subtracting −2 Np, in step 174, and adding 2 Mp, in step 172. The −Np corrects the parameter e so that the same test works after the phase is advanced.

Figure 3A:
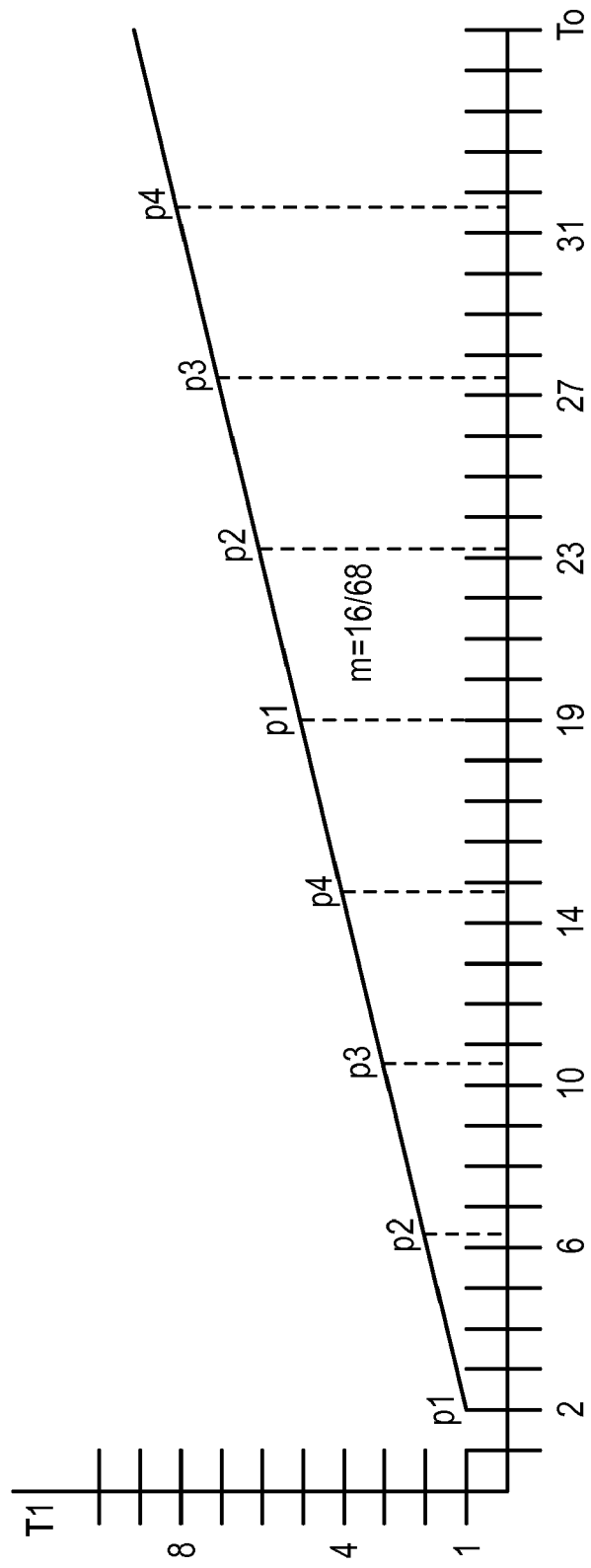
FIG. 3A shows a timing chart for the phase selection algorithm described in the flow chart of FIG. 2E.

The result is that the algorithm selects a phase that minimizes the error in the output frequency, i.e., it selects the phase that maintains the line in FIG. 3A, if possible. (There is no error if the new frequency can be synthesized using the existing phases. The error occurs when a needed phase is not present for a given M/N ratio.) Referring to the figure, a number of phase steps is advanced along the x-axis for a period $T_0$ of the input frequency $f_0$, and a number of phase steps is advanced along the y-axis for a period $T_1$ of the output frequency $f_1$, according to the integer ratio M/N. For example, suppose the output period is desired to be $4.25T_0$, i.e., $$T_1 = \frac{N}{M}T_0 \text{ or } T_1 = \frac{17}{4}T_0,$$

using integers. Then, there are 17 periods of To advanced for every for four periods of T1. If the multi-phase oscillator has four phases in its period, the slope, $m=\Delta y/\Delta x=Mp/Np$, of the phase line is 16/68, as shown in FIG. 3A. As can be observed from the figure, the phase selections p1, p2, p3 and p4, maintain a linear relationship between the input period and output period. In this case, there is no error in the output frequency.

The numeric values for 2 Mp, 2 Np, the initial value $e_1$, and the correction when y is incremented, respectively, are:

$2Mp=32, 2Np=136$ $e_1=2Mp-Np=-36,$ $2Mp-2Np=-104$

Applying the algorithm shown in FIG. 2E for each To clock yields the following table.

| $f_0$ cycle | | D |
|---|---|---|
| 0 | −36 | 0 |
| 1, 2, 3, 4 | −4, 28, −76, −44 | 32, 64, −40, −8 |
| 5, 6, 7, 8 | −12, 20, −84, −52 | 24, 56, −48, −16 |
| 9, 10, 11, 12 | −20, 12, −92, −60 | 16, 48, −56, −24 |
| 13, 14, 15, 16 | −28, 4, −100, −68 | 8, 40, −64, −32 |
| 17, 18, 19, 20 | −36, −4, 28, −76 | 0, 32, 64, −40 |
| 21, 22, 23, 24 | −44, −12, 20, −84 | −8, 24, 56, −48 |
| 25, 26, 27, 28 | −52, −20, 12, −92 | −16, 16, 48, −56 |
| 29, 30, 31, 32 | −60, −28, 4, −100 | −24, 8, 40, −64 |
| 33, 34, 35, 36 | −68, −36, −4, 28 | −32, 0, 32, 64 |
| 37, 38, 39, 40 | −76, −44, −12, 20 | −40, −8, 24, 56 |
| 41, 42, 43, 44 | −84, −52, −20, 12 | −48, −16, 16, 48 |
| 45, 46, 47, 48 | −92, −60, −28, 4 | −56, −24, 8, 40 |
| 49, 50, 51, 52 | −100, −68, −36, −4 | −64, −32, 0, 32 |
| 53, 54, 55, 56 | 28, −76, −44, −12 | 64, −40, −8, 24 |
| 57, 58, 59, 60 | 20, −84, −52, −20 | 56, −48, −16, 16 |
| 61, 62, 63, 64 | 12, −92, −60, −28 | 48, −56, −24, 8 |
| 65, 66, 67, 68 | 4, −100, −68, −36 | 40, −64, −32, 0 |

Figure 5:
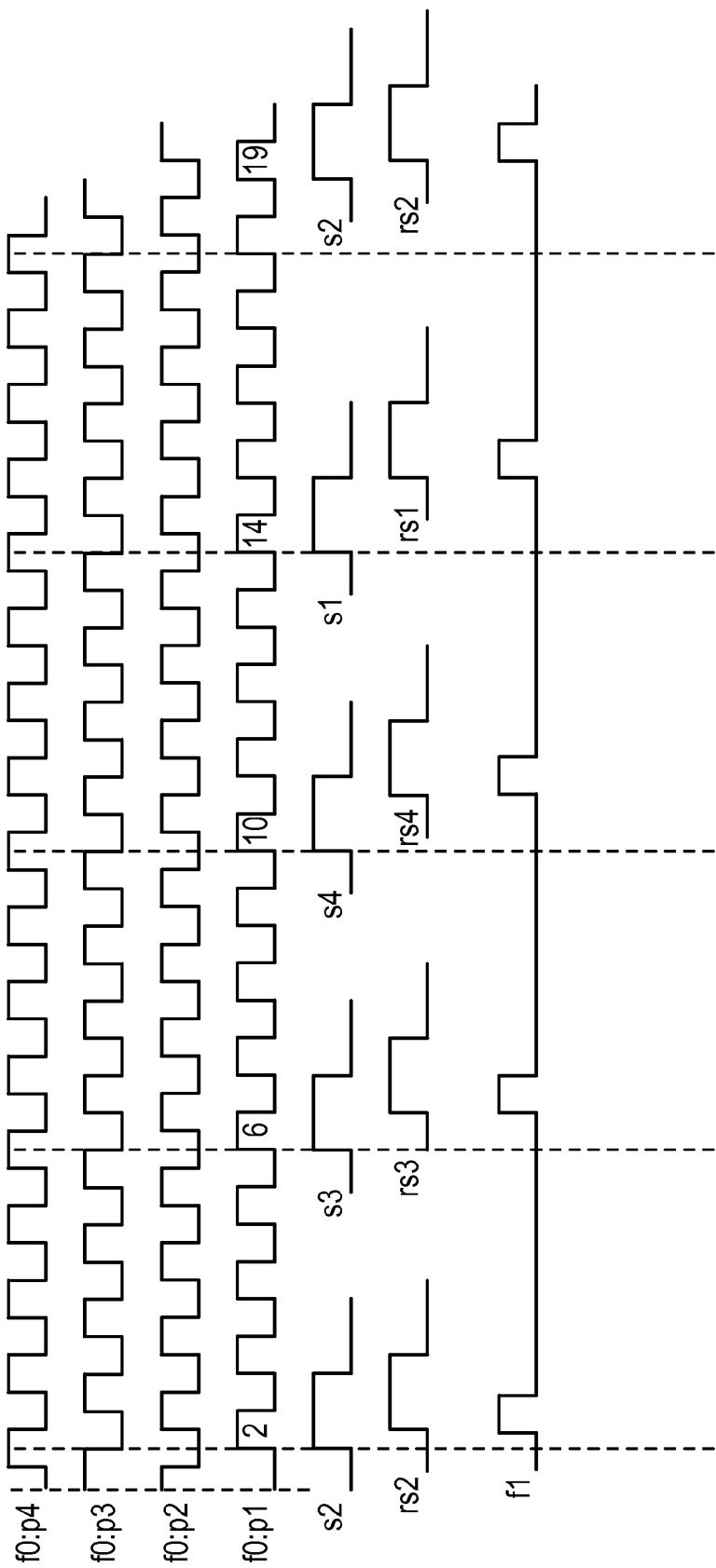
FIG. 5 shows a timing diagram for an embodiment of the retiming network of the present invention.

Inspection of the table and FIGS. 3A, 3B and 5 shows how the phase to be selected advances every 17 phase steps. For the first 17 phases, phase 2 is the proper selection for the transition of the output frequency. For the second 17 phases, phase 3 is the proper selection for the transition; for the third 17 phases, phase 4, and for the fourth 17 phases, phase 1. To make the generation of the phase select signals easier, the error value e has the initial offset $e_1$ removed in the D column, and the implementation in FIG. 2B reflects this. Also, it should be noted that the numbers in the $f_0$ cycle column of the table represent a count of the cycles of the input oscillator, which is ¼ the number of phase steps, in the example. This has the advantage of filtering out all but one point at which the parameter e (D-register less the initial offset) turns positive during the output period.

FIG. 2C shows an embodiment of the encoding and decoding circuitry 120 for use in the phase selection circuitry of the present invention. The encoding and decoding circuitry includes a D-to-binary conversion block 122 that receives the contents of the D register, less the quantity Np (vx bus), and creates a p-bit binary number 126 (two bits, b1b0, for the example shown) for the next phase select signal to be activated. While the example shown is for two bits, the number of bits depends on the number of phases into which a cycle of the multi-phase clock is divided. The binary decoder 128 then receives the binary number for the next phase select signal and decodes it into the p phase select signals ($s_1 \ldots s_p$) 54. According to the diagram, the p phase select signals 54 are enabled to be active from the decoder 128 when the circuitry 90 in FIG. 2B detects a greater than zero condition for the current value of D+2 Mp−Np (decision=true).

Continuing with the example above, where p=4, the binary conversion block 122 implements the map (D+2 Mp−Np) →b1b0: 64→11, 56→10, 48→01, 40→00.

In one embodiment, the binary conversion block includes a plurality of adder/subtractor units and pipeline registers, 130a,b, 132a,b 134a,b. Adder/subtractor unit 130a adds the product 2 Mp to the quantity (D−Np) on the vx bus 124 to start the calculations. Adder/subtractor units 132a and 134a implement the map (D+2 Mp−Np)→b1b0, for the different values of D. The pipeline registers capture the value of the adder/subtractor units in parallel with the update to the accumulator 88. (This means that the binary conversion block operates on D values that are one clock cycle prior to the point at which the parameter e goes positive). The advantage of the embodiment in FIG. 2C is that no binary dividers, which can slow down the calculations, are used; the only divisions, divide by 2 and divide by 4, that are needed are ones that can be performed by a shift register. Another advantage of this embodiment is that only $\log_2 p$ stages of adders/subtractor circuits are needed to implement the map, which makes it feasible to have a large number of phases in the multiphase oscillator. For example, if the multi-phase oscillator has a 1024 phases, only 10 stages are needed (in addition to the first).

Continuing with the example,
when D=32 (value of D before e goes positive) then:

| | |
|---|---|
| e = −4 < 0 | next ↑ |
| −4 + 2 Mp/2 = +12 > 0 | B1 = 1 |
| +12 − 2 Mp/4 = +4 > 0 | B0 = 1 |
| D = 32 + 2 Mp − 2 Np | D = 64 | and these values are latched into the pipeline registers and the accumulator on the next clock edge.

When D=24, then:

| | |
|---|---|
| e = −12 < 0 | next ↑ |
| −12 + 2 Mp/2 = +4 > 0 | B1 = 1 |
| +4 − 2 Mp/4 = −4 < 0 | B0 = 0 |
| D = 24 + 2 Mp − 2 Np | D = 56 | and when D=16, then:

| | |
|---|---|
| e = −20 < 0 | next ↑ |
| −20 + 16 = −4 < 0 | B1 = 0 |
| −4 + 8 = +4 > 0 | B0 = 1 |
| D = 16 + 2 Mp − 2 Np | D = 48 | and when D=8, then:

| | |
|---|---|
| e = −28 < 0 | next ↑ |
| −28 + 16 = −12 < 0 | B1 = 0 |
| −12 + 8 = −4 < 0 | B0 = 0 |
| D = 8 + 2 Mp − 2 Np | D = 40 |

As is clear, from FIGS. 2B and 2C, the parameter e (D+2 Mp−Np) is used to start the calculations. The quantities 2 Mp, 2 Np, and Np are computed by binary multiplication, preferably by using a shift register when p is a power of 2. The quantities 2 Mp/2 . . . 2 Mp/p can also be computed by using shift registers when p is a power of 2.

The binary decoder in FIG. 2C then decodes the binary number for the next phase select signal to create the four phase select signals ($s_1 \ldots s_p$). In the example shown in the figure, the decoder implements the map, b1b0→($s_1 \ldots s_4$):

00→1000 (which selects phase 1)
01→0100 (which selects phase 2)
10→0010 (which selects phase 3)
11→0001 (which selects phase 4).

Thus, at any point in time at which a transition must be created, one of the phase select signals is chosen, based on the algorithm, to select the phase with the least error.

FIG. 2D shows a general embodiment 140 of the encoding decoding circuitry for use in the phase selection circuitry of the present invention. There is an initial stage for computing the parameter e, and then $\log_2 p$ subsequent stages in the encoding block 142. The decoder decodes the $\log_2 p$ binary signals, one from each of the stages.

Figure 4:
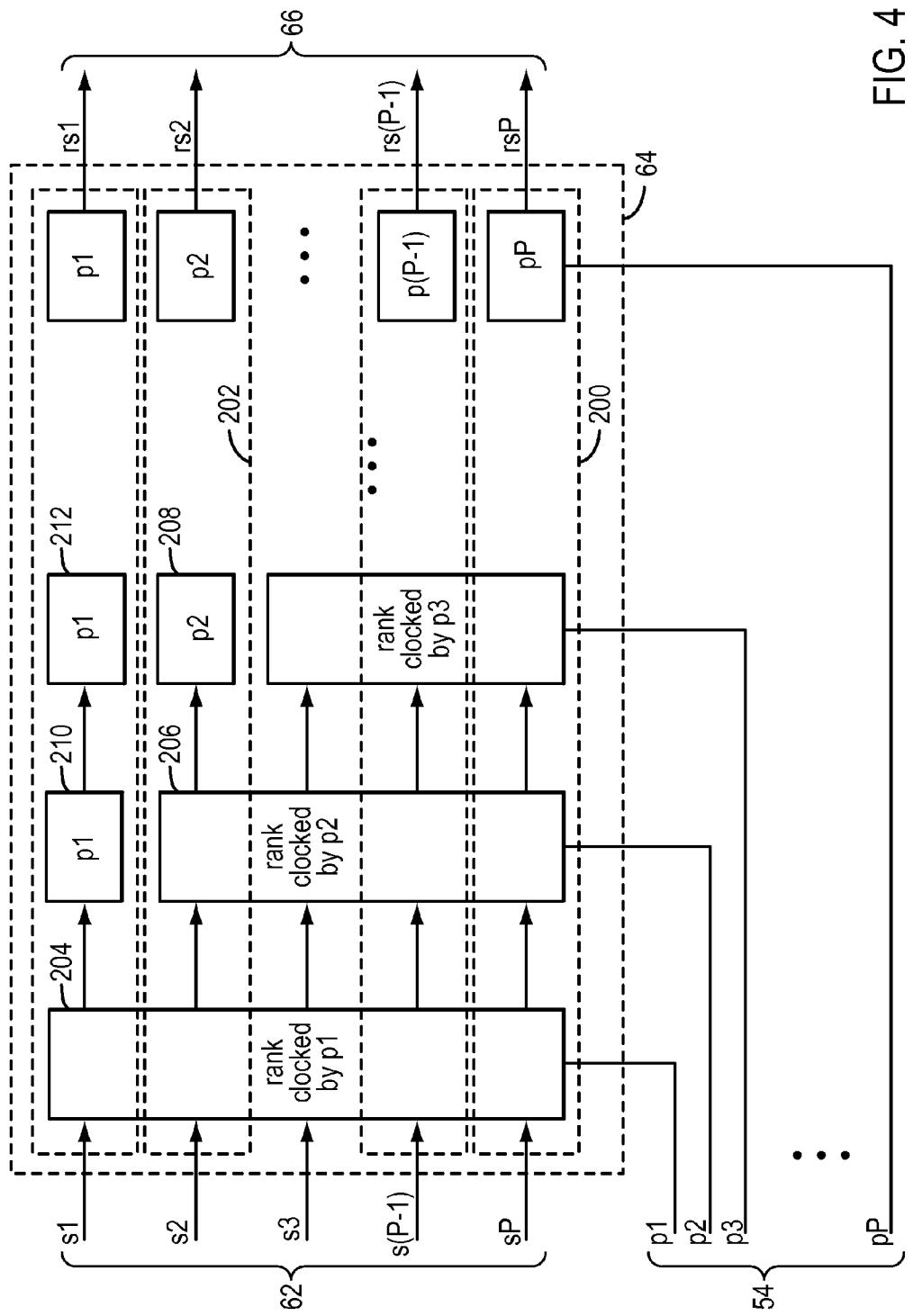
FIG. 4 shows an embodiment of the retiming network of the present invention.

FIG. 4 shows an embodiment of the retiming network 64 of the present invention. The phase select signals 62 leaving the arithmetic unit are synchronous with the clock used for that unit, specifically one of the phases of the multi-phase clock (phase 1 53 is shown in FIG. 2A). In order to synthesize to the desired frequency, with the phase accuracy available from the multi-phase clock, these signals must be made synchronous with the phase signals they select, if active. The network 64 thus includes circuitry that receives each of the phase select signals 62 and re-clocks the signals to have the actual phase that the name of the phase select signal implies. Thus, phase select signal $s_1$ is re-clocked so that it exits the retiming network as rs1, with phase 1 timing; phase select signal $s_2$ is re-clocked to exit the network as rs2 with the timing of phase 2; and similarly for the other ones. The circuitry included in this stage includes a chain of flip-flops 200, 202, each clocked with a different phase signal of the multiphase oscillator such that the re-clocked signal that emerges has the proper timing. For a signal that is distant in phase from the clock for the arithmetic unit (phase 1), several ranks 204, 206, 208 of flip-flops in the chain, clocked from different phases of the multi-phase clock, may be needed to properly retime the signal. For example, the signal $s_4$, which starts synchronous to the p1 phase, needs to be reclocked with the p2 phase, the p3 phase, and the p4 phase to emerge with correct timing. Signals that do not need as many ranks of flip-flops must have delays 210, 212 inserted so that these signals emerge with the proper relationship to the other retimed signals. Optimizations of the re-timing network are possible for phase select signals requiring a phase distant in time from the clock that is used to run the state machine. For example, a signal s16, which starts synchronous to p1, would, in one embodiment, require p2, p3, p4, p5, p6, p7, p8, p9, p10, p11, p12, p13, p14, p15 and p16 to exit with the timing of p16. However, it may be possible, with 16 phases, to skip every other phase, in synchronizing to p16. In general, not all phases of the multi-phase clock may be needed to re-time such signals, when there are a large number of phases, thus making the chain of flip-flops smaller.

FIG. 5 shows a timing diagram for an embodiment of the retiming network of the present invention in which there are four phase signals p1, p2, p3, p4 available from the multiphase oscillator. Signals s1, s2, s3 and s4 are synchronous with the edges of one of the phases (p1 in this case) of the multiphase oscillator. Signals rs1, rs2, rs3, and rs4 are synchronous with the phase for which they are labeled. Signals rs1, rs2, rs3 are thus positioned to properly select the corresponding phases of the multi-phase clock. Signals rs1 . . . rs4 are used to construct the waveform of the output clock.

Figure 6A:
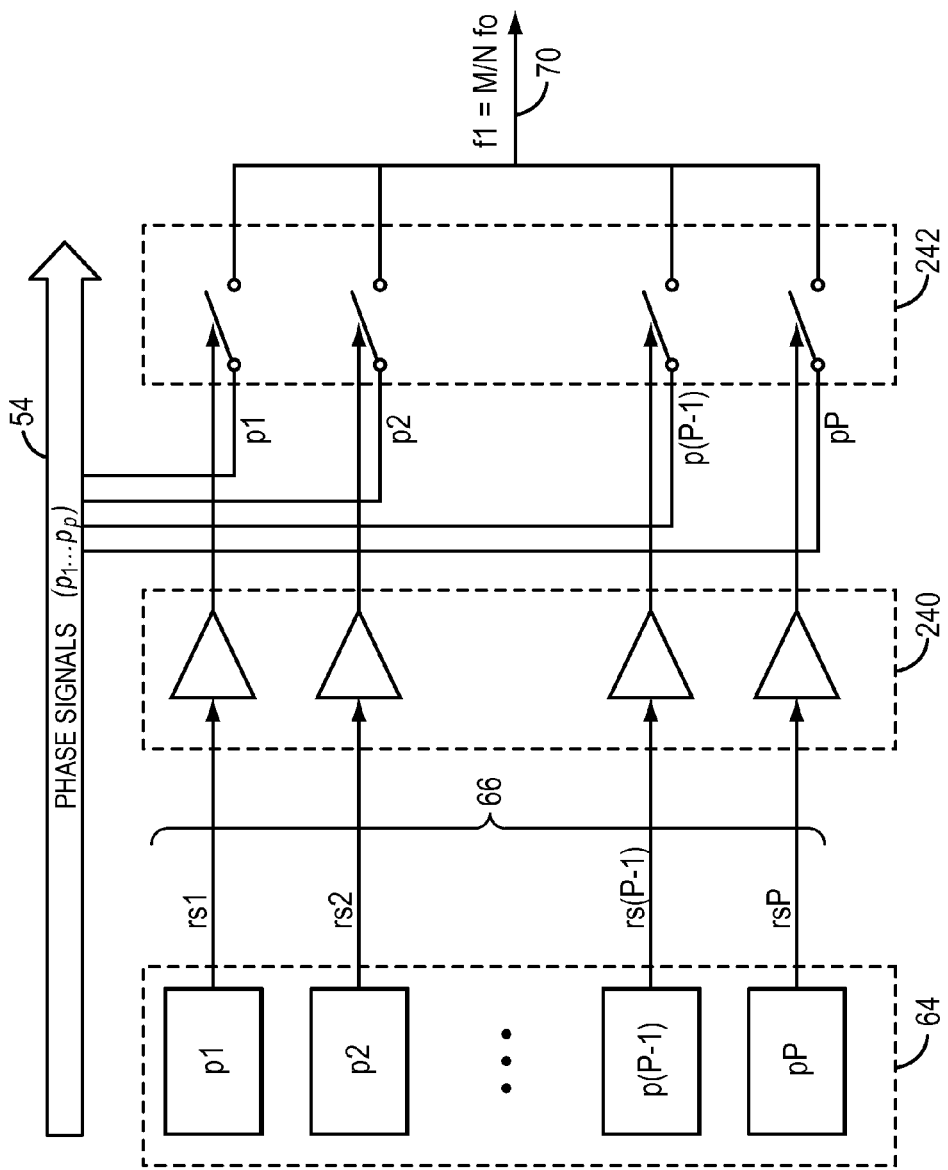
FIG. 6A shows a first embodiment of a clock edge combiner network for use in the clock construction circuitry.

After retiming, the re-timed signals ($rs_1 \ldots rs_p$) 66 are then used to construct the synthesized output clock. FIG. 6A shows a first embodiment of a clock edge combiner network for use in the clock construction circuitry and FIG. 6B shows a second embodiment of a clock edge combiner network for use in the clock construction circuitry.

In FIG. 6A, each of the retimed signals is taken from the last rank of the retiming network 64 and buffered by buffers 240 to control switches 242 that enable the actual phase signals 54 ($p_1 \ldots p_p$) of the multi-phase oscillator 52 to be multiplexed into the output clock node 70.

Figure 6B:
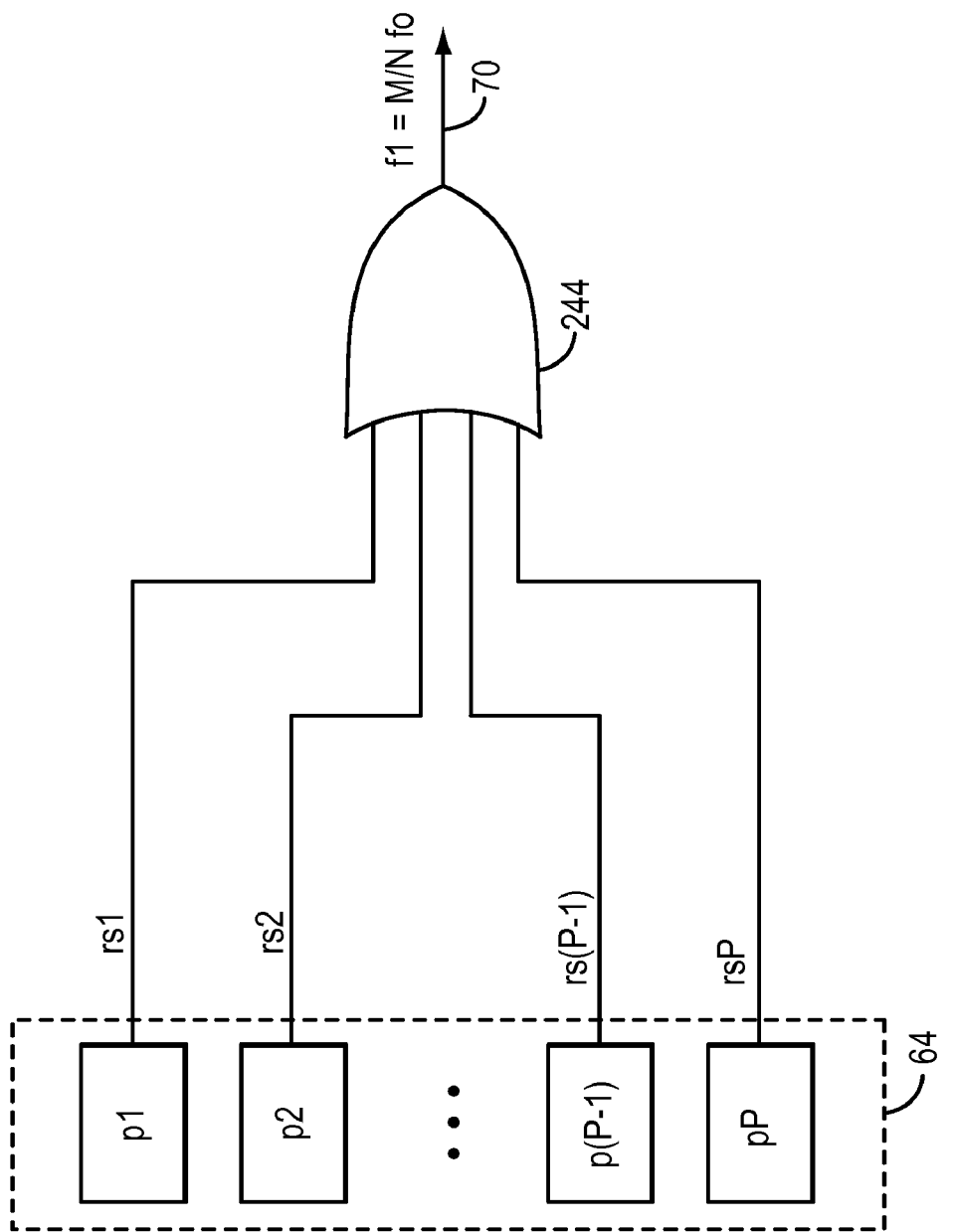
FIG. 6B shows a second embodiment of a clock edge combiner network for use in the clock construction circuitry.

In FIG. 6B, the re-timed signals taken from the last rank of the retiming network 64 are simply OR'ed together in gate 244. This is not as accurate as the first embodiment, as there is a flip-flop delay between the actual phase signal of the multi-phase oscillator and the output, but may be acceptable in some circumstances.

Figure 7:
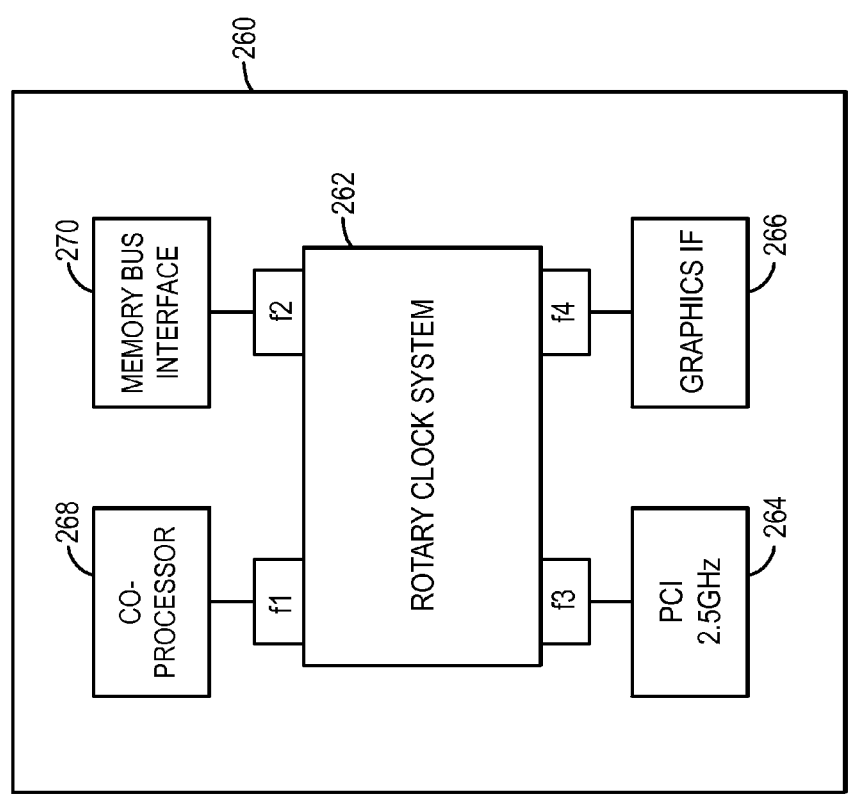
FIG. 7 shows one application of the frequency synthesizer of the present invention.

FIG. 7 shows one of many applications 260 of the frequency synthesizer of the present invention. A multiphase clock such as a rotary traveling wave oscillator 262 is setup to provide and distribute multiple phases to a plurality of blocks 264, 266, 268, 270 on an integrated circuit. Each of the blocks, a PCI block 264, a Graphics Interface block 266, a Co-processor block 268, and a memory bus block 270, has a need for a different frequency of operation which may be optimal for the functions the block carries out. A PCI block 264 for example, may need to operate at 2.5 GHz, the Graphics Interface block 266 may need to operate at 8 GHz, the Co-processor 268 may need to operate at 3.0 GHz and the memory block 270 may need to operate at 1.25 GHz. This creates a problem when the blocks need to communicate between each other. If the different frequencies are not coherent, synchronizers must be used. This causes a loss in communication speed between communicating blocks and introduces a serious chance of communication error, unless careful design techniques are followed. However, using the frequency synthesizer of the present invention, these problems are avoided, because the entire system 260 is phase coherent. This is true because the output frequencies f1, f2, f3, and f4 of the present invention synthesizer are phase coherent with the multi-phase oscillator 262. Thus, phase coherent communication is always possible between the blocks 264, 266, 268, 270. The particular phase in each block in which safe communication to another block is allowed can be known by the blocks and only in that phase will the block permit communication to the other block. The particular phase for which communication is safe between blocks may be different for each different pair of blocks. Coherent communication speeds up the interaction between the blocks and eliminates a source of error in design.

Figure 8:
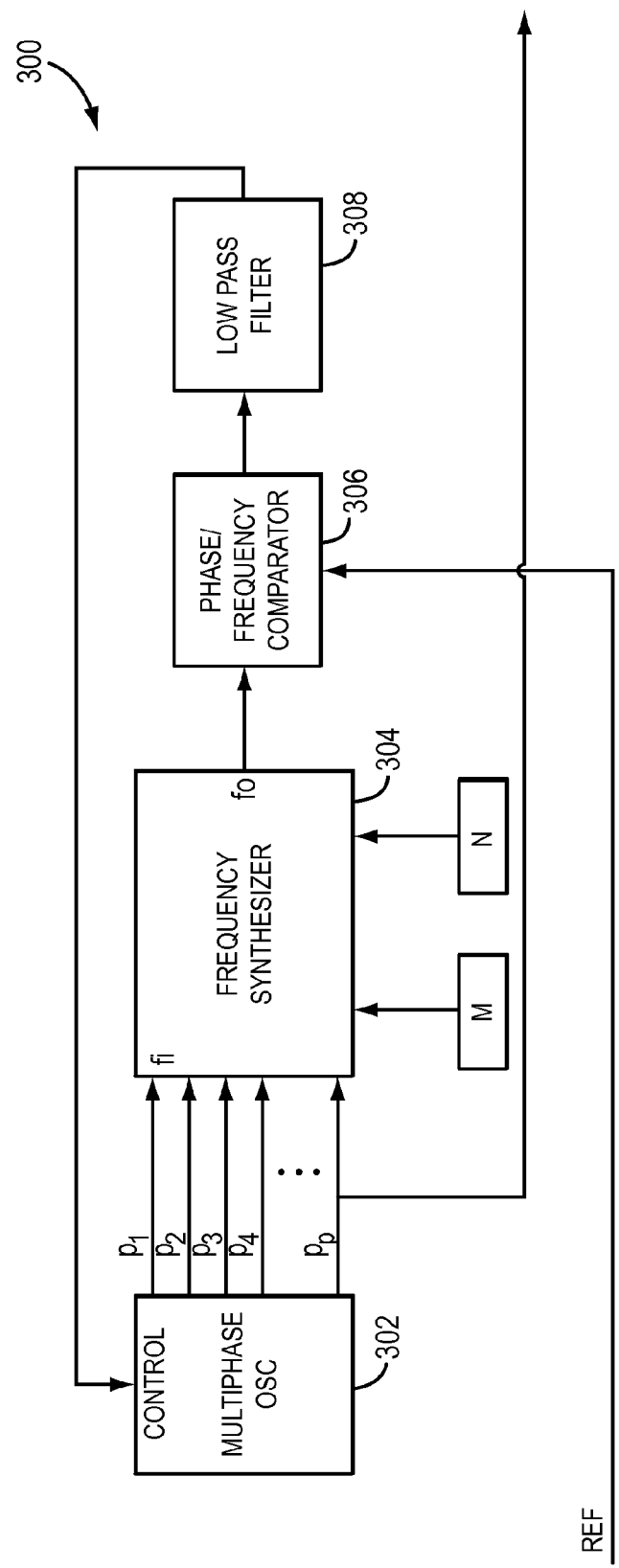
FIG. 8 shows another application of the frequency synthesizer of the present invention.

FIG. 8 shows another application of the frequency synthesizer of the present invention. This application, a phase locked loop, includes a multiphase oscillator 302 providing p phases, a frequency synthesizer 304 with input M and N that determine the output frequency of the synthesizer, a phase/frequency comparator 306, and low pass filter 308 for controlling the frequency and phase of the multiphase oscillator. The phase locked loop 300, when locked, causes the output frequency of the multiphase oscillator to be coherent with the reference REF and a multiple of the output frequency of the frequency synthesizer. In this case the multiple is N/M. Thus, the output frequency is a phase coherent multiple of the reference signal REF.

Although the present invention has been described in considerable detail with reference to certain preferred versions thereof, other versions are possible. Therefore, the spirit and scope of the appended claims should not be limited to the description of the preferred versions contained herein.

What is claimed is:

1. A frequency synthesizer circuit for synthesizing a waveform having an output frequency $f_1$, the circuit comprising:
   phase-selection circuitry having a clock input for receiving an input frequency provided by one of the plurality of phase signals of a multi-phase oscillator with frequency $f_o$, data inputs for receiving a first integer M and a second integer N, and a plurality of phase-selection outputs, wherein the phase-selection circuitry computes based on the first and second integers when to activate the phase-selection output that corresponds to one of the phase signals of the multi-phase oscillator to produce a transition in the waveform of the output frequency such that there are M cycles of the output frequency for N cycles of the input frequency and the ratio M/N is less than one;
   a retiming network having inputs that receive the plurality of phase signals of the multi-phase oscillator and the plurality of phase-selection outputs and outputs that carry re-timed signals, said retiming network re-timing each phase-selection output so that each re-timed output is synchronous with the oscillator phase signal corresponding to the phase-selection output; and
   clock construction circuitry that constructs the output frequency waveform based on the re-timed outputs of the retiming network.

2. A frequency synthesizer circuit as recited in claim 1, wherein the clock construction circuitry constructs the output frequency based on the outputs of the re-timing network and each of the phase signals of the multi-phase oscillator.

3. A frequency synthesizer circuit as recited in claim 1, wherein the phase-selection circuitry activates an output corresponding to a phase signal of the multi-phase oscillator that prevents cumulative error in the output frequency.

4. A frequency synthesizer circuit as recited in claim 1,
   wherein the multi-phase oscillator has p phase signals; and
   wherein the phase-selection circuitry includes:
   an accumulator for holding a quantity D received on its input when the clock input of the phase-selection circuitry transitions;
   means for forming a first sum (D+2Mp), where 2Mp is the product of 2, M and p;
   means for forming a second sum (D+2Mp−Np), where Np is the product of N and p;
   means for forming a third sum (D+2Mp−2Np), where 2Np is the product of 2, N and p;
   means for comparing the second sum with zero to provide, on an output, an indication of whether the second sum is greater than zero;
   means for selecting the third sum as the input to the accumulator when the comparing means indicates that the second sum is greater than zero, and selecting the second sum otherwise;
   means for converting the quantity D in the accumulator to a binary phase-selection signal; and
   means for decoding the binary phase-selection signal to produce the phase-selection outputs.

5. A frequency synthesizer circuit as recited in claim 4, wherein the products 2Mp, 2Np, and Np are each computed by a binary multiplier.

6. A frequency synthesizer circuit as recited in claim 5, wherein the binary multiplier is a shift register when p is a power of 2.

7. A frequency synthesizer circuit as recited in claim 4, wherein the means for forming a first sum includes a binary adder circuit having the quantity D and the product 2Mp applied to its inputs.

8. A frequency synthesizer circuit as recited in claim 7, wherein the means for forming a second sum includes a binary adder circuit having the sum D+2Mp and the product −Np applied to its inputs.

9. A frequency synthesizer circuit as recited in claim 7, wherein the means for forming a third sum includes a binary adder circuit having the sum D+2 Mp and the product −2 Np applied to its inputs.

10. A frequency synthesizer circuit as recited in claim 1,
    wherein the multi-phase oscillator has p phase signals; and
    wherein the phase-selection circuitry includes:
    an accumulator for holding on its output a quantity D;

a first adder circuit that provides on its output the sum of an integer product (Mp) and the quantity D held in the accumulator;

a second adder circuit that provides on its output the sum of an integer product (−Np) and the output of the first adder circuit;

a third adder circuit that adds an integer product (−2 Np) to the output of the first adder circuit;

a comparator for indicating on its output whether or not the output of the second adder circuit is greater than zero;

a multiplexer for selecting as output either the output of the first adder or output of the third adder, the output being used as the input of the accumulator, the multiplexer selecting the output of the third adder when the comparator indicates that the output of the second adder is greater than zero;

conversion circuitry for implementing a map of the quantities (D−Np+2 Mp), when they are positive, to a binary number that is used to activate a phase selection output; and a binary decoder for decoding the phase-selection binary number into the plurality of phase-selection outputs when the comparator indicates that the output of the second adder is greater than zero.

11. A frequency synthesizer circuit as recited in claim 10, wherein the conversion circuitry includes:

means for adding the product −Np to the quantity D in the accumulator to form the sum D−Np;

means for adding +2 Mp to the sum (D−Np) to form the sum (D−Np+2 Mp);

means for mapping the sum (D−Np+2 Mp) to a binary phase-selection number, when the comparator indicates that the second adder circuit output is greater than zero.

12. A frequency synthesizer circuit as recited in claim 10, wherein the conversion circuitry includes:

a plurality of adder circuits arranged in a chain, an output of one adder circuit being the input of the next adjacent adder circuit, each adder circuit configured to add either the product +2 Mp/q or the product −2 Mp/q to the input, depending on a selection input, wherein the parameter q is a binary number selected from the set 1 through p, the parameter q associated in increasing order to the adder circuits in the chain, starting with the value 1 being associated with the first adder circuit, wherein the input of first adder is connected to an adder that provides the sum of the output of the accumulator and the product (−Np); and means, connected to each adder circuit, for indicating whether the output of the corresponding adder is greater than zero, each indication being the selection input to the next adjacent adder circuit.

13. A frequency synthesizer circuit as recited in claim 12, wherein the indicating means is a comparator that compares the adder circuit output to zero.

14. A frequency synthesizer circuit as recited in claim 12, wherein the adder circuitry operates using 2's complement arithmetic; and wherein the indicating means is the most significant output bit of the adder circuit.

15. A frequency synthesizer circuit as recited in claim 1, wherein the re-timing network includes a plurality of chains of flip-flops for retiming each phase-selection signal of the phase-selection circuitry, each flip-flop in each chain being clocked with one of the phase signals of the multi-phase oscillator.

16. A frequency synthesizer circuit as recited in claim 1, wherein the clock construction circuitry includes a plurality of transmission gates each connected between a phase signal of the multi-phase oscillator and a common output node on which the output frequency waveform is generated, each transmission gate being enabled to pass the phase signal to which said gate is connected to the common output node when instructed by a re-timed phase-selection output that corresponds to the phase signal to which the transmission gate is connected.

17. A frequency synthesizer circuit as recited in claim 1, wherein the clock construction circuitry includes an OR-gate having a plurality of inputs, each input connected to one of the re-timed phase-selection outputs, and an output on which the output frequency waveform is generated.

18. A frequency synthesizer circuit for synthesizing a waveform having an output frequency $f_1$, the circuit comprising:

means, responsive to an input frequency and a first and second integer M and N, for activating one of a plurality of phase-selection outputs, wherein said activating means computes based on the first and second integers when to activate a phase-selection output corresponding to one of the phase signals of a multi-phase oscillator to produce a transition in the waveform of the output frequency such that there are M cycles of the output frequency for N cycles of the input frequency and the ratio M/N is less than one, the activated phase selection output being such as to prevent accumulation of any error in the output frequency;

means for re-timing each phase-selection output so that each re-timed phase-selection output is synchronous with the oscillator phase signal corresponding to the phase-selection output and means for constructing, based on the retimed phase selection output the waveform of the output frequency.

19. A method of synthesizing a waveform of an output frequency from the phase signals of a multi-phase oscillator which oscillates at frequency $f_1$, the method comprising:

activating one of a plurality of phase selection outputs in response to an input frequency and first and second integers M and N to select one of the phase signals of the multi-phase oscillator to produce a transition in the waveform of the output frequency such that there are M cycles of the output frequency for N cycles of the input frequency and the ratio M/N is less than one, the selected phase signal being such as to prevent accumulation of error in the output frequency;

re-timing each phase-selection output so that each re-timed phase-selection output is synchronous with the oscillator phase signal selectable by the phase-selection output;

selecting a phase signal of the multi-phase oscillator using the retimed phase-selection output; and combining each selected phase signal of the multi-phase oscillator to form the waveform of the output frequency.

20. A method of synthesizing a waveform as recited in claim 19, wherein the step of activating one of the plurality of phase-selection outputs includes:

initializing a quantity D;

upon the occurrence of each cycle of the input frequency while D is negative, computing the sum (D+2 Mp) and replacing D with the sum, where p is the number of phases of the multi-phase oscillator, and 2 Mp is the product of 2, M and p;

upon the occurrence of each cycle of the input frequency while D is positive, computing the sum (D+2 Mp−Np) and replacing D with the sum, Np is the product of N and p;

upon the occurrence of a cycle of the input frequency when the quantity D changes from negative to positive, providing a selection output;

mapping the sum (D+2 Mp−Np) to a binary phase-selection value; and decoding the binary selection value to activate one of a plurality of phase-selection outputs upon the occurrence of the selection output.

21. A method of synthesizing a waveform as recited in claim 20, wherein the quantity D is initialized to zero.

22. A method of synthesizing a waveform as recited in claim 19, wherein the step of retiming the activated phase-selection output includes, for each phase-selection output, synchronizing the phase-selection output in a plurality of steps, each step being synchronous to one of the phase signals of the multi-phase oscillator, the number of steps depending on the particular phase-selection output, such that the re-timed phase-selection output is synchronous with the phase signal of the multi-phase oscillator selectable by the phase-selection output.

23. A method of synthesizing a waveform as recited in claim 19, wherein the step of selecting a phase signal of the multi-phase oscillator with the retimed phase-selection output includes enabling a gate to pass the selected phase signal to a common node on which the waveform of the output frequency is provided.

24. A method of synthesizing a waveform as recited in claim 19, wherein the step of combining each selected phase signal of the multi-phase oscillator to form the waveform of the output frequency includes connecting each selected phase signal to a common node on which the waveform of the output frequency is provided.

25. A method of synthesizing a waveform of an output frequency from the phase signals of a multi-phase oscillator, the method comprising:

activating one of a plurality of phase-selection outputs in response to an input frequency and first and second integers M and N to produce a transition in the waveform of the output frequency such that there are M cycles of the output frequency for N cycles of the input frequency and the ratio M/N is less than one, the activated selection output corresponding to the phase signal that prevents any accumulation of error in output frequency;

re-timing each phase-selection output so that each re-timed phase selection output is synchronous with the oscillator phase signal corresponding to the phase-selection output; and combining each retimed activated phase-selection output to form the waveform of the output frequency.

26. A method of synthesizing a waveform as recited in claim 25, wherein the step of combining each re-timed activated phase-selection output includes logically 'OR'ing the re-timed active phase-selection outputs to form the waveform of the output frequency.

27. A frequency synthesizer circuit for synthesizing a waveform having an output frequency $f_1$, the circuit comprising:

a multi-phase oscillator that provides a plurality of phase signals each having a frequency $f_o$, wherein the multi-phase oscillator is a rotary traveling wave oscillator whose signal path carries the traveling wave, and wherein the plurality of phase signals are available as physical taps of the signal path;

phase-selection circuitry having a clock input for receiving an input frequency provided by one of the plurality of phase signals of the multi-phase oscillator, a pair of data inputs for receiving a first integer M and a second integer N, and a plurality of phase-selection outputs, wherein the phase-selection circuitry computes based on the first and second integers when to activate a phase-selection output corresponding to one of the phase signals of the multi-phase oscillator to produce a transition in the waveform of the output frequency such that there are M cycles of the output frequency for N cycles of the input frequency and the ratio M/N is less than one;

a re-timing network having a plurality of inputs for receiving the plurality of signals of the multi-phase oscillator, and outputs that carry re-timed signals, the re-timing network re-timing each phase-selection output so that each re-timed phase selection output is synchronous with the oscillator phase signal corresponding to the phase-selection output; and clock construction circuitry that constructs the output frequency waveform based on the re-timed outputs of the retiming network.

28. A frequency synthesizer circuit as recited in claim 27, wherein the multi-phase oscillator is a rotary traveling wave oscillator whose signal path carries the traveling wave; and wherein the plurality of phase signals is available as physical taps of the signal path.

* * * * *